US009791119B2

(12) United States Patent
Oh et al.

(10) Patent No.: US 9,791,119 B2
(45) Date of Patent: Oct. 17, 2017

(54) LIGHT EMITTING MODULE AND HEAD LAMP INCLUDING THE SAME

(71) Applicant: LG INNOTEK CO., LTD., Seoul (KR)

(72) Inventors: Nam Seok Oh, Seoul (KR); Yun Min Cho, Seoul (KR); Jong Woo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/989,704

(22) Filed: Jan. 6, 2016

(65) Prior Publication Data

US 2016/0116129 A1 Apr. 28, 2016

Related U.S. Application Data

(63) Continuation of application No. 13/368,140, filed on Feb. 7, 2012, now Pat. No. 9,261,252.

(30) Foreign Application Priority Data

Jul. 11, 2011 (KR) .......................... 10-2011-0068481

(51) Int. Cl.
  *H01L 27/15* (2006.01)
  *F21S 8/10* (2006.01)
  (Continued)

(52) U.S. Cl.
  CPC ......... *F21S 48/1159* (2013.01); *F21S 48/115* (2013.01); *F21S 48/1154* (2013.01); *F21S 48/12* (2013.01); *F21S 48/1225* (2013.01); *F21S 48/13* (2013.01); *F21S 48/215* (2013.01); *F21S 48/2218* (2013.01); *H01L 27/153* (2013.01); *H05K 1/05* (2013.01); *H05K 1/183* (2013.01); *F21V 3/0463* (2013.01); *F21V 7/22* (2013.01); *F21V 9/16* (2013.01); *F21V 13/02* (2013.01); *F21Y 2115/10* (2016.08);
  (Continued)

(58) Field of Classification Search
  CPC .. H01L 33/0004–33/648; H01L 27/153; H01L 2224/48091; H01L 25/0753
  See application file for complete search history.

(56) References Cited

U.S. PATENT DOCUMENTS

2006/0049475 A1\* 3/2006 Wang .................. H01L 25/0753
  257/432
2006/0220050 A1 10/2006 Higaki et al.
  (Continued)

FOREIGN PATENT DOCUMENTS

KR   10-2011-0060074 A   6/2011

*Primary Examiner* — Cuong B Nguyen
(74) *Attorney, Agent, or Firm* — Birch, Stewart, Kolasch & Birch, LLP

(57) ABSTRACT

Disclosed is a light emitting module including a light emitting device package having a circuit board having a cavity, an insulation substrate arranged in the cavity, with a conductive pattern formed thereon, and at least one light emitting device disposed on the insulation substrate, with being electrically connected with the conductive pattern; and a glass cover located on the light emitting device package, with lateral surfaces, a top surface and an open bottom surface, wherein the light emitting device package and the circuit board are electrically connected with each other.

19 Claims, 8 Drawing Sheets

(51) Int. Cl.
*H05K 1/05* (2006.01)
*H05K 1/18* (2006.01)
*H01L 25/075* (2006.01)
*H01L 33/58* (2010.01)
*F21V 9/16* (2006.01)
*H05K 3/28* (2006.01)
*F21V 3/04* (2006.01)
*F21V 7/22* (2006.01)
*F21V 13/02* (2006.01)
*F21Y 115/10* (2016.01)

(52) U.S. Cl.
CPC .......... *H01L 25/0753* (2013.01); *H01L 33/58* (2013.01); *H01L 2224/48091* (2013.01); *H05K 3/284* (2013.01); *H05K 2201/09745* (2013.01); *H05K 2201/10106* (2013.01)

(56) References Cited

U.S. PATENT DOCUMENTS

| | | |
|---|---|---|
| 2007/0170450 A1 | 7/2007 | Murphy |
| 2007/0170453 A1 | 7/2007 | Takemori et al. |
| 2007/0194336 A1 | 8/2007 | Shin et al. |
| 2009/0242923 A1 | 10/2009 | Goodrich |
| 2009/0321778 A1* | 12/2009 | Chen ................. H01L 24/81 257/99 |
| 2010/0102344 A1* | 4/2010 | Ueji .................. H01L 33/507 257/98 |
| 2010/0181590 A1 | 7/2010 | Chen |
| 2011/0020961 A1 | 1/2011 | Chuang et al. |
| 2011/0101405 A1 | 5/2011 | Chang et al. |
| 2011/0127912 A1 | 6/2011 | Lee et al. |
| 2012/0133268 A1 | 5/2012 | Hwu et al. |
| 2012/0138982 A1* | 6/2012 | Chen ................. H01L 33/62 257/98 |

* cited by examiner

[FIG. 1]
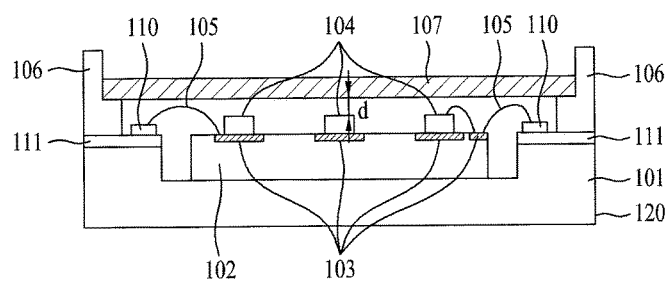
[FIG. 2a]
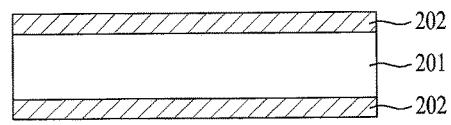
[FIG. 2b]

[FIG. 3]
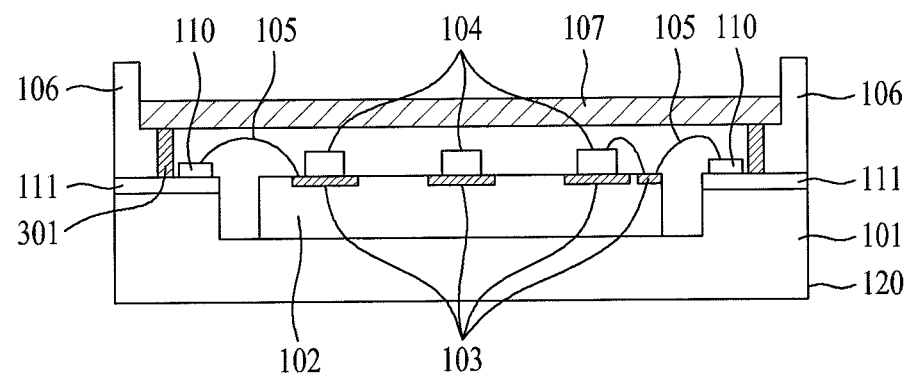
[FIG. 4]
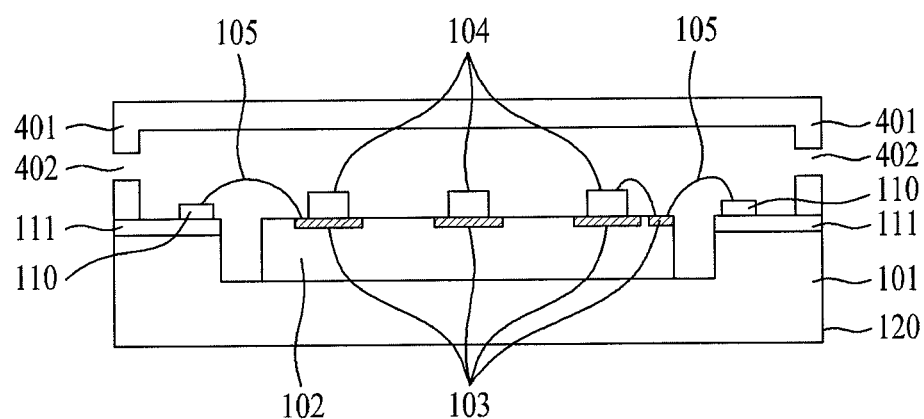

【FIG. 5】
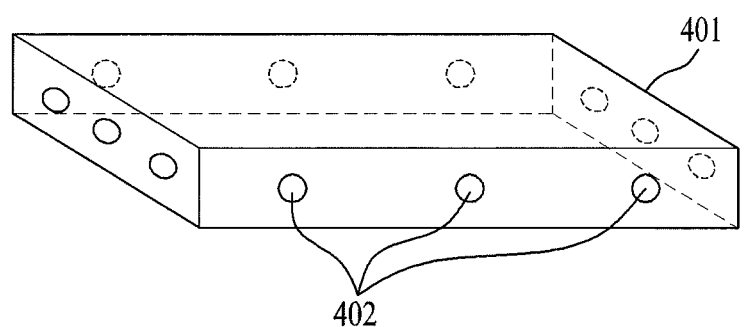

[FIG. 6]
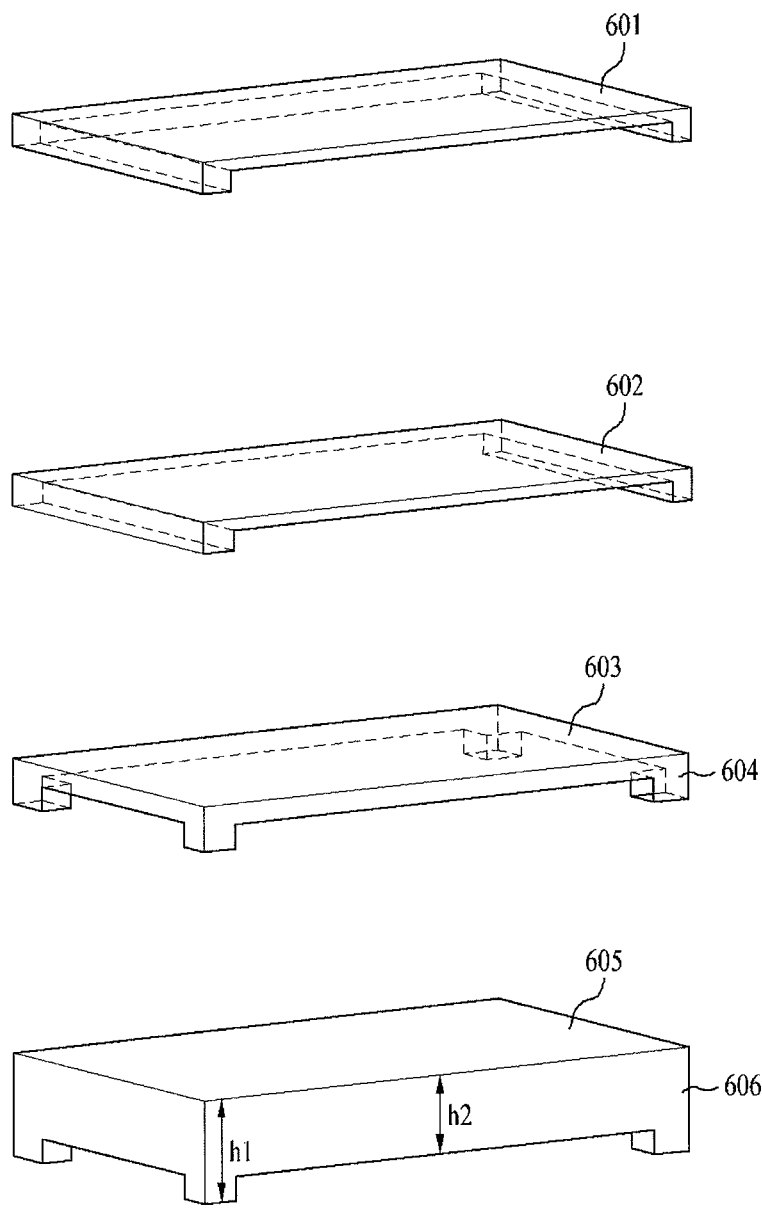

[FIG. 7]
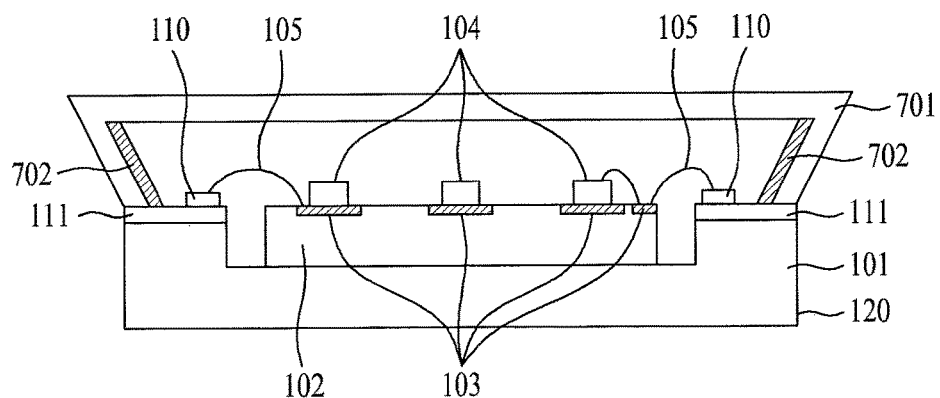
[FIG. 8]
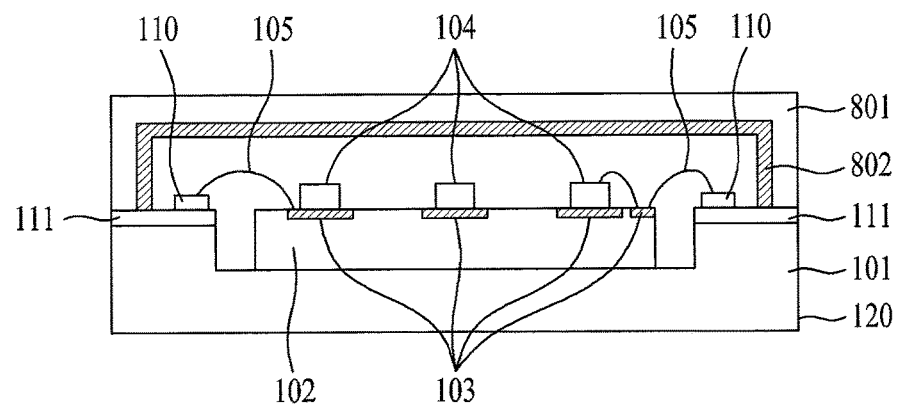

[FIG. 9]
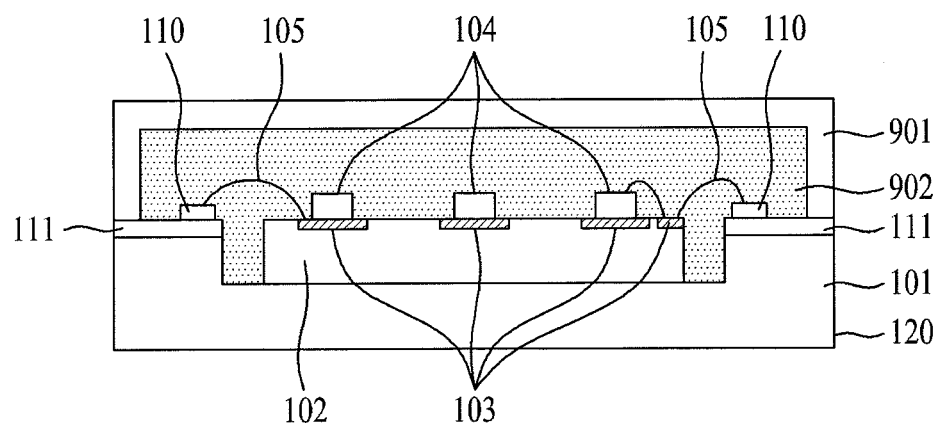
[FIG. 10]
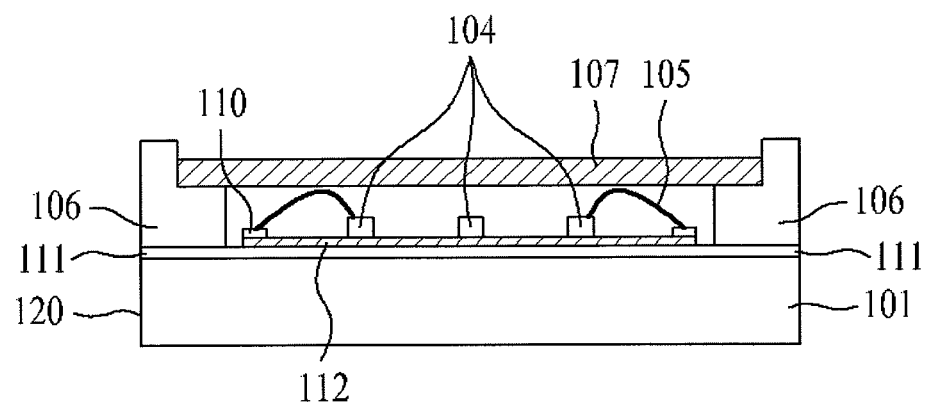

[FIG. 11]
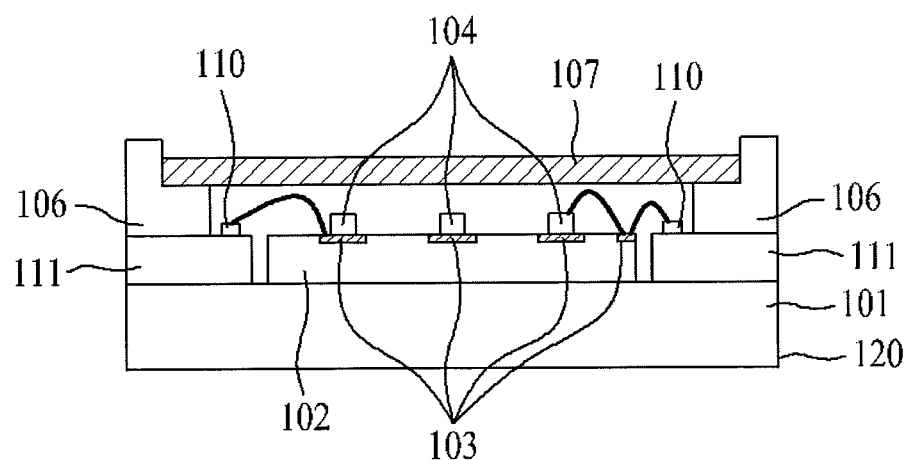
[FIG. 12]
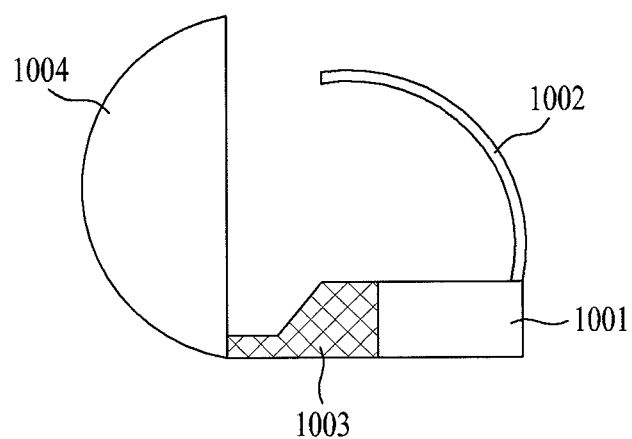

[FIG. 13]
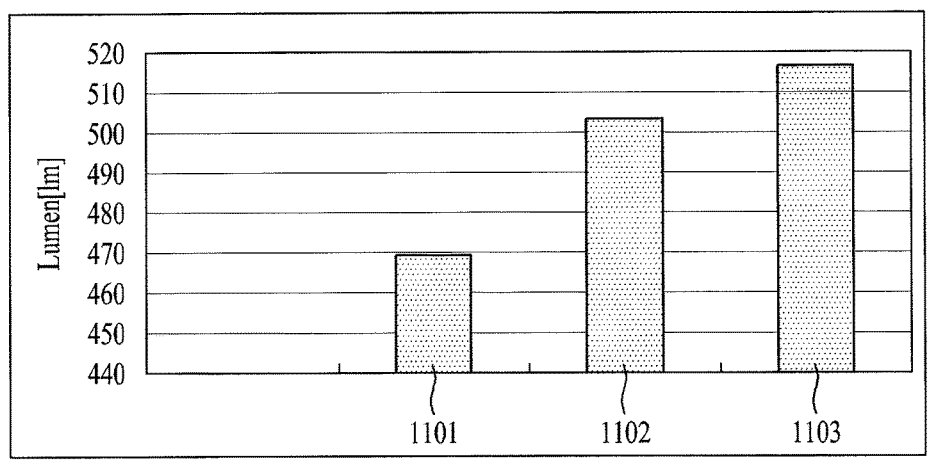

LIGHT EMITTING MODULE AND HEAD LAMP INCLUDING THE SAME

CROSS-REFERENCE TO RELATED APPLICATION

This application is a Continuation of co-pending application Ser. No. 13/368,140 filed on Feb. 7, 2012, which claims priority under 35 U.S.C. §119 from Korean Application No. 10-2011-0068481 filed in Korea on Jul. 11, 2011, the subject matter of which is hereby incorporated in its entirety by reference as if fully set forth herein.

TECHNICAL FILED

Embodiments may relate to a light emitting module and a head lamp including the same.

BACKGROUND

Generally, a light emitting diode (LED) may one of semiconductor devices that convert an electric energy into light. The light emitting diode has several advantages of low power consumption, semipermanent use, fast response speed, safety and environment-friendliness. Accordingly, there have been many studies under progress to replace a conventional light source with the light emitting diode and the light emitting device has been used as a light source of a lighting system such as a variety of lamps used indoor and outdoor, a liquid crystal display device, an electronic display board, a streetlamp and the like.

Meanwhile, such the light emitting diode can be applied to a head lamp for a vehicle. In a conventional head lamp according to a prior art, a wire and a light emitting device are exposed and there might be a disadvantage of degraded reliability of the head lamp.

SUMMARY

Accordingly, the embodiments may provide a light emitting module having improved reliability and a head lamp including the same.

In one embodiment, a light emitting module comprises a light emitting device package comprising a circuit board having a cavity, an insulation substrate disposed in the cavity, with a conductive pattern disposed thereon, and at least one light emitting device disposed on the insulation substrate, with being electrically connected with the conductive pattern; and a glass cover disposed on the light emitting device package, with lateral surfaces, a top surface and an open bottom surface, wherein the light emitting device package and the circuit board are electrically connected with each other.

In another embodiment, a light emitting module comprises a circuit board; at least one light emitting device disposed on the circuit board, with being electrically connected with the circuit board; and a glass cover disposed on the circuit board, spaced apart a predetermined distance from a top surface of the light emitting device, the glass cover comprising lateral surfaces, a top surface and an open bottom surface.

In another embodiment, a head lamp comprises a light emitting module configured to emit a light; a reflector configured to reflect the light emitted from the light emitting module; and a lens configured to refract the light emitted from the light emitting module and the light reflected by the reflector, wherein the light emitting module comprises a circuit board; at least one light emitting device disposed on the circuit board, with being electrically connected with the circuit board; and a glass cover disposed on the circuit board, spaced apart a predetermined distance from a top surface of the light emitting device, the glass cover comprising lateral surfaces, a top surface and an open bottom surface.

BRIEF DESCRIPTION OF THE DRAWINGS

Arrangements and embodiments may be described in detail with reference to the following drawings in which like reference numerals refer to like elements and wherein:

FIG. 1 is a diagram illustrating a light emitting module according to an embodiment;

FIGS. 2a and 2b are diagrams illustrating a glass cover according to an embodiment;

FIG. 3 is a diagram illustrating a glass supporting part according to an embodiment;

FIG. 4 is a diagram illustrating a light emitting module according to another embodiment;

FIG. 5 is a diagram illustrating a glass cover according to another embodiment;

FIG. 6 is a diagram illustrating a glass cover according to a further embodiment;

FIG. 7 is a diagram illustrating a light emitting module according to a further embodiment;

FIG. 8 is a diagram illustrating a light emitting module according to a still further embodiment;

FIG. 9 is a diagram illustrating a light emitting module according to a still further embodiment;

FIG. 10 a diagram illustrating a light emitting module according to a still further embodiment;

FIG. 11 a diagram illustrating a light emitting module according to a still further embodiment;

FIG. 12 is a diagram illustrating a head lamp having the light emitting module applied thereto according to an embodiment; and FIG. 13 is a diagram illustrating an effect of the light emitting module according to the embodiments.

DETAILED DESCRIPTION

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

The thickness and size of each layer may be exaggerated, emitted or illustrated schematically in the drawings, for explanation and precision. The size of each component shown in the drawings may not reflect the actual size completely.

As follows, a light emitting module according to embodiments will be described in reference to the accompanying drawings.

FIG. 1 illustrates a light emitting module according to an embodiment.

In these embodiments or other embodiments, the light emitting device may be semiconductor light emitting device, for example, light emitting diode.

In reference to FIG. 1, the light emitting module according to the embodiment may include a light emitting device package having a metal substrate 101 having a cavity, an insulative substrate 102 located in the cavity and at least one light emitting device 104 disposed on the insulation substrate 102, a pad 110 electrically connected with the light emitting device package via a wire 105, and a glass cover 107 located over the light emitting device 104 to transmit the light generated from the light emitting device 104.

A circuit pattern (not shown) and an insulation layer 111 may be located on the metal substrate 101. The metal substrate 101, the insulation layer 111 and the circuit pattern may consist of a circuit board 120.

The metal substrate 101 may be a heat sink plate with high thermal conductivity and it may be formed of alloy of copper, aluminum, silver or gold, with the cavity.

The cavity of the metal substrate 101 may be a mounting part configured to mount the light emitting device package and it may have a broader area than the light emitting device package. The mounting part to mount the package may formed by exposing a surface of the metal substrate after eliminate the insulation layer and the circuit pattern formed on the metal substrate 101.

A thickness of the metal substrate 101 may be at least 0.5 mm. The cavity of the metal substrate 101 has a depth of approximately 100~500 um and accounts for about 10~70% of a total area of the metal substrate 101.

The insulation layer 111 may act as an adhesive layer for a metal substrate 101, a circuit pattern (not shown), a pad 110 connected with the circuit pattern to provide currents to a light emitting device 104 and a supporting part 106, and be formed of epoxy-based or polyamide-based resin, oxide or nitride.

The circuit pattern may be formed on the insulation layer 111 and also a solder resistor layer may be formed on the insulation layer 111.

The pad 110 may be electrically connected with the light emitting device package via the wire 105. Alloy of nickel, silver, gold or palladium may be surface-treated to a surface of the pad 110.

The light emitting device package may include an insulation substrate 102, a conductive pattern 103 located on the insulation substrate 102 and a plurality of light emitting devices 104 disposed on the conductive pattern 103.

The insulation substrate 102 may be formed of nitride having high thermal conductivity and it may be adhered to the metal substrate 101 to secure heat radiation.

A thickness of the insulation substrate 102 may be in a range of 100 um to 1 mm.

The light emitting device 104 may have a light emitting structure having a first conductive type semiconductor layer, an active layer and a second conductive type semiconductor layer, a first electrode disposed on the first conductive type semiconductor layer and a second electrode disposed on the second conductive type semiconductor layer.

The plurality of the light emitting devices 104 may be aligned in the light emitting device package and they may be connected in serial or in parallel.

The light emitting device 104 or the conductive pattern 103 may be electrically with each other via the pad 110 and the wire 105.

The conductive pattern 103 may have an electrode region where the light emitting devices 104 are adhered and a connection region where neighboring light emitting devices are wire-bonded.

The conductive pattern 103 may be formed as a thickness of 0.1~300 um. And the pad 110 may be formed as a thickness of 0.1~350 um.

The glass cover 107 is located over the light emitting device package to protect the light emitting device 104.

The glass cover 107 may have lateral surfaces, a top surface and an open bottom surface. And a thickness of the glass cover 107 has no limit.

The glass cover 107 may be anti-reflective-coated, to transmit the light generated from the light emitting device 104 efficiently, without reflecting the light.

For the anti-reflective coating, an anti-reflective coating film is attached to a glass base or an anti-reflective coating layer is formed by spin-coating or spray-coating anti-reflective coating liquid.

The anti-reflective coating layer may include at least one of $TiO_2$, $SiO_2$, $Al_2O_3$, $Ta_2O_3$, $ZrO_2$ or $MgF_2$.

According to another embodiment, the glass cover 107 may be located on a supporting part 106 located on the circuit board 120.

A distance (d) between the light emitting device 104 and the glass cover 107 may be in a range of 0.2~40 mm.

The glass cover 107 according to an embodiment may have a hole formed in a predetermined surface to exhaust gas generated by the heat of the light emitting device 104 or the circuit board 120.

A predetermined one of the lateral surfaces of The glass cover 107 may be open and the gas generated by the heat of the light emitting device 104 or the circuit board 120 may be exhausted.

The glass cover may have a dome shape and a hole may be formed in the predetermined surface of the glass cover. Accordingly, the gas generated by the heat generated from the light emitting device 104 or the circuit board 120 may be exhausted.

The glass cover 107 may include a color filter to transmit only a light at a specific wavelength out of the lights generated from the light emitting device 104.

According to embodiments, the glass cover 107 may have a predetermined pattern and an orientation angle of the light generated from the light emitting device 104 may be adjusted. In this instance, the type and shape of the pattern may not be limited to a specific one.

A phosphor layer may be formed on at least one surface of the glass cover 107 and the light generated from the light emitting device 104 may be converted into a light at a specific wavelength.

When the phosphor layer is provided in the glass cover 107, phosphor particles may convert the wavelength of the light generated from the light emitting device 103 to output a light at a specific wavelength.

For example, when the light emitting device 104 outputs a blue light, the phosphor layer provided in the glass cover 107 may have a yellow phosphor to convert the output light into a white light.

The glass cover 107 may have a light extraction pattern formed in at least one predetermined surface thereof and the light generated from the light emitting device 104 may be reflected diffusively to improve the light extraction efficiency of the light emitting module.

According to an embodiment, an inclined surface may be formed in at least one of the lateral surfaces of the glass cover 107 and a reflection layer may be formed on the inclined surface to reflect the light generated from the light emitting device 104. The reflection layer may include at least one Al, Ag, Pt, Rh, Rd, Pd or Cr.

The inclined surface of the glass cover 107 may be tilted toward the circuit board at approximately 10~90 degrees.

According to an embodiment, the supporting part 106 may have a reflection layer having at least one of Al, Ag, Pt, Rh, Rd, Pd or Cr to reflect the light generated from the light emitting device 104.

In this instance, the reflection layer may include a metal layer having a reflective material, for example, Al, Ag, Pt, Rh, d, Pd, Cr or an alloy of Al, Ag, Pt or Ph.

The light emitting module according to the embodiment may have the glass cover 107 and it may physically protect the wire 105 and the light emitting device 104 provided in the light emitting device package.

For example, the light emitting module for a head lamp may be exposed to an external shock and heat, while moving at a rapid speed. Accordingly, the wire and other elements provided in the light emitting module may be exposed to physical danger factors. The light emitting module according to the embodiment may have the glass cover 107 and the wire and the light emitting device may be protected physically.

Also, the light module may include the glass cover 107 having an anti-reflective coating layer, such that the inner elements of the light emitting module may be protected and that the light generated from the light emitting device 104 may be transmitted efficiently.

FIG. 2a is a diagram illustrating a glass cover according to an embodiment.

In reference to FIG. 2a, a glass cover 107 provided in the light emitting module may include an anti-reflective coating layer 202. An anti-reflective coating film may be attached to a glass material 201 or anti-reflective coating liquid may be spin-coated or spray-coated, to form the anti-reflective coating layer 202.

As a result, the light emitting module according to the embodiment may minimize the light reflected inward within the glass cover 107 and thus it may have an effect in that the light generated from the light emitting device 104 may be transmitted efficiently.

FIG. 2b is a diagram illustrating a glass cover according to another embodiment.

In reference to FIG. 2b, a glass cover 701 according to this embodiment may include a predetermined surface where a light extraction pattern 107a is formed. Accordingly, the light generated from the light emitting device 104 may be reflected diffusively and light extraction efficiency of the light emitting module may be improved.

FIG. 3 is a diagram illustrating a supporting part according to an embodiment.

In reference to FIG. 3, a supporting part 106 may be located on the circuit board 120 and the glass cover 107 may be supported by the supporting part 106.

A reflection layer 301 may be formed on a surface of the supporting part 106 to reflect the light generated from the light emitting device 104. For example, the reflection layer 301 may be formed on a lateral surface of the supporting part 106 adjacent to the light emitting device 104.

The reflection layer 301 may include a metal layer formed of a reflective material, for example, Al, Ag, Pt, Rh, Rd, Pd, Cr or an alloy of Al, Ag, Pt or Rh.

The reflection layer 301 of the supporting part 106 may reflect the light generated from the light emitting device 104 to transmit the glass cover 107, such that the light extraction efficiency of the light emitting module may be improved advantageously.

FIG. 4 is a diagram illustrating a light emitting module according to another embodiment.

In reference to FIG. 4, a glass cover 401 may be located on a circuit board 120 and the glass cover 401 may have a lateral surface, a top surface and an open bottom surface.

At least one hole 402 may be formed in one of the surfaces to exhaust gas generated from heat of a light emitting device 104 or the circuit board 120.

FIG. 5 is a diagram illustrating a glass cover according to another embodiment.

In reference to FIG. 5, a glass cover 401 may exhaust gas generated from heat of a light emitting device 104 or a circuit board 120 outside via at least one hole 402.

FIG. 6 is a diagram illustrating a glass cover according to a further embodiment.

In reference to FIG. 6, a glass cover 601 and 602 may include lateral surfaces and a top surface. At least one of the lateral surfaces may be open to exhaust gas generated by heat of a light emitting device 104 or a circuit board 120 outside.

According to an embodiment, a lateral surface of a glass cover 603 and 605 may have two or more different heights.

For example, a lateral surface of the glass cover 603 may have two different heights and a region having a larger height may be a supporting member 604 having a column shape.

For example, a lateral surface of the glass cover 604 may be a surface having two different weights (h1 and h2).

FIG. 7 is a diagram illustrating a light emitting module according to another embodiment.

In reference to FIG. 7, a glass cover 701 provided in the light emitting module according to this embodiment may be located on a circuit board 120 and the glass cover 701 may include a reflection layer 702 formed on a predetermined surface of lateral surfaces.

The reflection layer 702 may reflect light generated from a light emitting device 104 and it may include at least one of Al, Ag, Pt, Rh, Rd, Pd or Cr, for example. The reflection layer 702 including at least one of them to reflect the light generated from the light emitting device 104 may be formed on at least predetermined surface of the lateral surfaces.

Also, the lateral surface of the glass cover 701 may include an inclined surface and the reflection layer 702 may be formed on the inclined surface.

The inclined surface of the glass cover 701 may be tilted toward the circuit board 120 at approximately 10~90 degrees.

As mentioned above, the reflection layer 701 may have a metal layer having a reflective material, for example, Al, Ag, Pt, Rh, Rd, Pd, Cr or an alloy of Al, Ag, Pt or Rh.

The reflection layer 701 formed on the inclined surface of the glass cover 701 may reflect the light generated from the light emitting device 104 such that light extraction efficiency of the light emitting device may be improved advantageously.

FIG. 8 is a diagram illustrating a light emitting module according to a further embodiment.

In reference to FIG. 8, a glass cover 801 provided in the light emitting module according to this embodiment may have a selective wavelength converting layer 802.

According to an embodiment, the selective wavelength converting layer 802 may be a color filter and it may transmit light at a predetermined wavelength out of the lights generated from the light emitting device 104.

According to another embodiment, the selective wavelength converting layer 802 may be a phosphor layer and it may convert a light at a first wavelength region into a light at a second wavelength region out of the light generated from the light emitting device 104.

When the selective wavelength converting layer 802 is a phosphor, phosphor particles may convert a wavelength of the light generated from the light emitting device 104 into another wavelength to be an output light at a predetermined wavelength band. For example, when the light emitting device 104 outputs a blue light, the selective wavelength converting layer 802 provided in the glass cover 801 may have a yellow phosphor and the output light may be a white light.

FIG. 9 is a diagram illustrating a light emitting module according to a further embodiment.

In reference to FIG. 9, a resin layer 902 or a phosphor layer may be filled into a gap between a light emitting device and a glass cover 901 in the light emitting device according to this embodiment. The resin layer 902 may have a phosphor to convert a wavelength of the light emitted from the light emitting device into another wavelength and a phosphor layer may be provided additionally. The resin layer may be formed of a silicon material or a synthetic material.

When phosphor particles are provided in the resin layer 902, phosphor particles may convert the wavelength of the light generated from the light emitting device 104 into another wavelength and a light at a predetermined wavelength band may be output. For example, when the light emitting device 104 outputs a blue light, the resin layer 902 may have a yellow phosphor to output a white light.

In this instance, a distance between the light emitting device 104 and the glass cover 901 may be 0.2~40 mm.

FIG. 10 is a diagram illustrating a light emitting device according to a still further embodiment.

In reference to FIG. 10, the light emitting module according to this embodiment may include a circuit board 120 having a metal substrate 101, an insulation layer 111 and a circuit pattern 112, at least one light emitting device 104 disposed on the circuit board 120, with being electrically connected with the circuit board 120, a supporting part 106 located on a predetermined region of the circuit board 120 where the circuit pattern 112 is not formed, and a glass cover 107 supported by the supporting part 160, with being spaced apart a predetermined distance from a top surface of the light emitting device 104.

The circuit board 120 may have no cavity and a pad 110 may be located on the circuit pattern 112 to be electrically connected with the light emitting device 104 via a wire 105.

Alternatively, the glass cover 107 having lateral surfaces and a top surface may be directly located on the circuit board 120, without the supporting part 106.

FIG. 11 is a diagram illustrating a light emitting module according to a still further embodiment.

In reference to FIG. 11, the light emitting module according to this embodiment may include a metal substrate 101, an insulation substrate 102 located on the metal substrate 101, with a surface having a conductive pattern 103 located therein and at least one light emitting device 104 disposed on the insulation substrate 102. The light emitting device 104 may be electrically connected with the conductive pattern 103.

A pad 110 may be located on an insulation layer 111 formed on the metal substrate 101 and the pad 110 may be electrically connected with the light emitting device 104 via wire 105.

The metal substrate 101, the insulation layer 111 located on the metal substrate 101 and the circuit pattern (not shown) located on the insulation layer 111 may form a circuit board 120.

A supporting part 106 may be disposed on a predetermined portion of the circuit board 120 where the insulation substrate 102 is not located. A glass cover 107 may be supported by the supporting part 106.

Alternatively, a glass cover 107 having lateral surfaces and a top surface may be directly located on the circuit board 120, without the supporting part 106.

The glass cover 107 may be spaced apart a predetermined distance from the top surface of the light emitting device 104.

FIG. 12 is a diagram illustrating a head lamp according to an embodiment, having a light emitting module applied thereto.

In reference to FIG. 12, light having transmitted a glass cover of a light emitting module 1001 provided in the head lamp according to this embodiment may be reflected by a reflector 1002 and a shade 1003. After that, the light may be travel forwardly, passing through a lens 1004.

The lens 1004 may refract the generated by the light emitting module 1001 and the light reflected by the reflector 1002, to enable the lights to travel forwardly.

As mentioned above, the light emitting module 1001 according to the embodiment may include the glass cover and it have the effect of preventing physical breakage of the wire and the light emitting device and of maintaining luminous efficiency of the light emitting device.

FIG. 13 is a diagram illustrating the effects of the light emitting module according to the embodiments.

In reference to FIG. 13, the light emitting module according to the embodiments may include the glass cover. Brightness of the light that transmits the glass cover including only the glass material may be increased, compared with brightness of the light that transmits the glass cover including the anti-reflective layer.

Also, brightness of the light that transmits the glass cover including the reflection layer formed on the supporting part or at least predetermined region of the glass cover (1102) may be increased, compared with brightness of the light that transmits the glass cover having only the anti-reflective layer (1103).

A plurality of light emitting devices may be mounted on the light emitting device package provided in the light emitting module and the embodiment may not be limited thereto.

The plurality of the light emitting device packages according to the embodiment may be arrayed on a substrate. As optical members, a light guide plate, a prism sheet and a diffusion sheet may be arranged on a luminous passage of the light emitting device packages. Those light emitting device packages, the substrate and the optical members may be functioned as a light unit. A further embodiment may be realized by a display device, a pointing device or a lighting system including the semiconductor light emitting device or the light emitting device package according to the embodiments. For example, the lighting system may include a lamp and a streetlamp.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module comprising:
   a light emitting device package comprising a circuit board having a metal substrate;
   an insulation substrate having a conductive pattern disposed on the metal substrate, and at least one light emitting device disposed on the insulation substrate, and being electrically connected with the conductive pattern;
a supporting part disposed on a predetermined portion of the circuit board;
a glass cover disposed on the light emitting device package, with lateral surfaces and a top surface;
a pad electrically connected with the light emitting device package via a wire; and
an insulation layer disposed on the metal substrate, the pad being disposed on a top surface of the insulation layer,
wherein the supporting part includes a first portion and a second portion, a height of the first portion being lower than a height of the second portion,
wherein the first portion supports the glass cover,
wherein a distance between the top surface of the glass cover and a bottom surface of the circuit board is smaller than a distance between a top surface of the second portion and the bottom surface of the circuit board, and
wherein a distance between a top surface of the insulation substrate and the bottom surface of the circuit board is equal to a distance between the top surface of the insulation layer and the bottom surface of the circuit board.

2. The light emitting module according to claim 1, wherein the supporting part is disposed on the metal substrate.

3. The light emitting module according to claim 2, wherein the supporting part is disposed on a circumference region of the metal substrate.

4. The light emitting module according to claim 1, wherein the glass cover is spaced apart a predetermined distance from a top surface of the light emitting device.

5. The light emitting module according to claim 1, wherein the glass cover comprises an anti-reflective coating layer disposed on at least one surface thereof.

6. The light emitting module according to claim 1, wherein the glass cover is disposed above the light emitting device.

7. The light emitting module according to claim 1, wherein a distance between the light emitting device and the glass cover is within a range of 0.2~40 mm.

8. The light emitting module according to claim 1, wherein the supporting part comprises a reflection layer comprising at least one of Al, Ag, Pt, Rh, Rd, Pd or Cr.

9. The light emitting module according to claim 1, wherein at least one surface of the glass cover comprises a light extraction pattern.

10. The light emitting module according to claim 1, wherein the light emitting device comprises:
a light emitting structure comprising a first conductive type semiconductor layer, an active layer and a second conductive type semiconductor layer;
a first electrode disposed on the first conductive type semiconductor layer; and
a second electrode disposed on the second conductive type semiconductor layer.

11. The light emitting module according to claim 1, wherein a height of the pad is higher than a height of the conductive pattern.

12. The light emitting module according to claim 1, wherein the insulation layer acts as an adhesive layer to adhere the metal substrate to the pad and to adhere the metal substrate to the supporting part.

13. The light emitting module according to claim 1, wherein the glass cover includes a selective wavelength converting layer facing the light emitting device package to transmit light at a predetermined wavelength out of light generated from the light emitting device.

14. The light emitting module according to claim 1, further comprising a resin layer or a phosphor layer filled into a gap between the light emitting device and the glass cover.

15. A light emitting module comprising:
a light emitting device package comprising a circuit board having a metal substrate;
an insulation substrate having a conductive pattern disposed on the metal substrate, and at least one light emitting device disposed on the insulation substrate, and being electrically connected with the conductive pattern;
a glass cover disposed on the light emitting device package;
a pad electrically connected with the light emitting device package via a wire; and
an insulation layer disposed on the metal substrate, the pad being disposed on a top surface of the insulation layer,
wherein at least one groove is formed on a surface of the insulation substrate, and the conductive pattern is disposed in the groove,
wherein a distance between a top surface of the insulation substrate and a bottom surface of the circuit board is equal to a distance between a top surface of the conductive pattern and the bottom surface of the circuit board, and
wherein the distance between the top surface of the insulation substrate and the bottom surface of the circuit board is equal to a distance between the top surface of the insulation layer and the bottom surface of the circuit board.

16. The light emitting module according to claim 15, wherein a height of the pad is higher than a height of the conductive pattern.

17. The light emitting module according to claim 15, further comprising a supporting part disposed on a predetermined portion of the circuit board,
wherein the supporting part includes a first portion and a second portion, a height of the first portion being lower than a height of the second portion.

18. The light emitting module according to claim 15, wherein a separation region is formed between the insulation layer and the insulation substrate, and
wherein a portion of the glass cover corresponds to the separated region.

19. A head lamp comprising:
a light emitting module configured to emit a light;
a reflector configured to reflect the light emitted from the light emitting module; and
a lens configured to refract the light emitted from the light emitting module and the light reflected by the reflector,
wherein the light emitting module comprises:
a light emitting device package comprising a circuit board having a metal substrate;
an insulation substrate having a conductive pattern disposed on the metal substrate, and at least one light emitting device disposed on the insulation substrate, and being electrically connected with the conductive pattern;
an insulation layer disposed on the metal substrate;

a supporting part disposed on a predetermined portion of the circuit board;
a glass cover disposed on the light emitting device package, with lateral surfaces and a top surface,
wherein the supporting part includes a first portion and a second portion, a height of the first portion being lower than a height of the second portion, and wherein the first portion supports the glass cover,
wherein the metal substrate has a constant thickness, and
wherein a distance between a top surface of the insulation substrate and a bottom surface of the circuit board is equal to a distance between a top surface of the insulation layer and the bottom surface of the circuit board.

* * * * *